US011133822B2

(12) United States Patent
Nakano

(10) Patent No.: US 11,133,822 B2
(45) Date of Patent: *Sep. 28, 2021

(54) ANALOG-DIGITAL CONVERTER AND SOLID-STATE IMAGING ELEMENT

(71) Applicant: SHARP KABUSHIKI KAISHA, Sakai (JP)

(72) Inventor: Toshiaki Nakano, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/625,669

(22) PCT Filed: Jun. 8, 2018

(86) PCT No.: PCT/JP2018/022106
§ 371 (c)(1),
(2) Date: Dec. 20, 2019

(87) PCT Pub. No.: WO2018/235638
PCT Pub. Date: Dec. 27, 2018

(65) Prior Publication Data
US 2021/0135682 A1        May 6, 2021

(30) Foreign Application Priority Data

Jun. 20, 2017    (JP) .............................. JP2017-120418

(51) Int. Cl.
*H03M 7/16*     (2006.01)
*H03M 1/08*     (2006.01)
*H04N 5/3745*   (2011.01)

(52) U.S. Cl.
CPC ........... *H03M 7/16* (2013.01); *H03M 1/0872* (2013.01); *H04N 5/37455* (2013.01)

(58) Field of Classification Search
CPC ... H03M 1/0872; H03M 7/16; H04N 5/37455
See application file for complete search history.

(56) References Cited

U.S. PATENT DOCUMENTS

| 10,708,532 | B2 * | 7/2020 | Ushinaga ........... H04N 5/37455 |
| 2009/0026352 | A1 * | 1/2009 | Shimomura ........... H04N 5/378 |
| | | | 250/214 R |
| 2010/0253821 | A1 * | 10/2010 | Yamamoto ............. H04N 5/378 |
| | | | 348/294 |
| 2011/0074994 | A1 * | 3/2011 | Wakabayashi ...... H03M 1/1023 |
| | | | 348/302 |
| 2013/0015329 | A1 * | 1/2013 | Iwaki ...................... H03M 1/36 |
| | | | 250/208.1 |

(Continued)

FOREIGN PATENT DOCUMENTS

JP         2011-234326 A        11/2011

*Primary Examiner* — Lam T Mai
(74) *Attorney, Agent, or Firm* — ScienBiziP, P.C.

(57) ABSTRACT

To simplify the circuit configuration and design of an analog-digital converter. A low-order bit latch section latches, as low-order bits, Gray code data corresponding to a reference clock by using, as a trigger, inversion of an output of a comparator. A high-order bit counter section counts one or both of edges of a CNT signal corresponding to the reference clock and stops a count of high-order bits by using, as a trigger, inversion of an output of the comparator.

7 Claims, 7 Drawing Sheets

(56) References Cited

U.S. PATENT DOCUMENTS

| | | | |
|---|---|---|---|
| 2013/0120622 A1* | 5/2013 | Hiraoka | H04N 5/335 |
| | | | 348/294 |
| 2015/0028190 A1* | 1/2015 | Shin | H03M 1/14 |
| | | | 250/208.1 |
| 2015/0042856 A1* | 2/2015 | Nakamura | H04N 5/378 |
| | | | 348/297 |
| 2015/0181145 A1* | 6/2015 | Lee | H04N 5/3745 |
| | | | 250/208.1 |
| 2015/0189214 A1* | 7/2015 | Kurose | H01L 25/18 |
| | | | 250/208.1 |
| 2015/0326243 A1 | 11/2015 | Iwaki | |
| 2015/0326811 A1* | 11/2015 | Nishida | H04N 5/379 |
| | | | 348/308 |
| 2020/0053310 A1* | 2/2020 | Ushinaga | H03M 1/1295 |

* cited by examiner

ANALOG-DIGITAL CONVERTER AND SOLID-STATE IMAGING ELEMENT

TECHNICAL FIELD

The present invention relates to an analog-digital converter that can be mounted in a solid-state imaging element, such as a CMOS image sensor, and a solid-state imaging element including the analog-digital converter.

BACKGROUND ART

Existing CMOS image sensors include, for each of pixels arranged in a matrix, a floating diffusion layer and an amplifier. A dominating CMOS image sensor is of a column parallel output type in which one row is selected from a pixel array and outputs from the one row are read out simultaneously in a column direction. The outputs read out in the column direction are converted into digital signals for each column by an analog-digital converter.

With respect to an analog-digital converter mounted in a CMOS image sensor of the column parallel output type, various configurations have been proposed. Among the various configurations, a dominating analog-digital converter has a configuration in which two pieces of data, that is, data in an initial state and data in which signal accumulation has been achieved are converted from analog to digital form and are subjected to subtraction processing (digital. CDS) to thereby achieve low noise characteristics. For example, PTL 1 discloses a technique in which a circuit configuration for high-order bits differs from a circuit configuration for low-order bits to thereby optimize current consumption and a circuit area.

FIG. 7 is a block diagram illustrating an example of a configuration of a solid-state imaging element 101 in which an existing analog-digital converter disclosed in PTL 1 is mounted. As illustrated in this figure, the solid-state imaging element 101 includes a pixel section 102, a row selection circuit 103, a reference voltage generation section 104, a counter generation section 105, an analog-digital conversion section (ADC section) 106, a column selection circuit 107, and a signal processing section 108. The pixel section 102 includes a plurality of unit pixels 121. The ADC section 106 includes a plurality of analog-digital converters (ADCs) 161. Each of the ADCs 161 includes a comparator 162, a low-order bit latch section 163, and a high-order bit counter section 164.

The row selection circuit 103 selects unit pixels 121 of any one row among a plurality of rows in the pixel section 102. Each of the selected unit pixels 121 of the one row converts incident light into an analog signal and transfers the analog signal to the corresponding ADC 161 through a corresponding vertical signal line 122.

The reference voltage generation section 104 generates a reference voltage that varies in accordance with a reference clock. The comparator 162 compares an input analog signal voltage with the reference voltage and inverts an output signal at a point in time when the reference voltage exceeds the analog signal voltage. The counter generation section 105 generates counter data 151. The low-order bit latch section 163 latches the counter data 151 by using, as a trigger, a point in time when an output signal of the comparator 162 is inverted. The low-order bit latch section 163 generates a carry signal 165. The high-order bit counter section 164 counts high-order bits in response to the carry signal 165.

Thus, the existing solid-state imaging element 101 illustrated in FIG. 7 does not count low-order bits that undergo many data transitions but latches the counter data 151 generated by the counter generation section 105. This enables low current consumption. Furthermore, when the high-order bit counter section 164 is constituted by a binary counter, subtraction processing can be promptly performed, thereby enabling a reduction in the circuit size of the solid-state imaging element 101.

CITATION LIST

Patent Literature

PTL 1: Japanese Unexamined Patent Application Publication No. 2011-234326 (published on Nov. 17, 2011)

SUMMARY OF INVENTION

Technical Problem

In the existing solid-state imaging element 101 illustrated in FIG. 7, a bit inconsistency between data of the latched counter data 151 and the carry signal 165 may be caused. For this reason, a point in time when the carry signal 165 is acquired has to be controlled by using a mask signal 152 generated by the counter generation section 105. Furthermore, in some cases, the mask signal 152 has to be generated from the counter data 151. As a result, the circuit configuration and design of the ADC 161 are not able to be simplified.

The present invention has been made to solve the above-described issues and to simplify the circuit configuration and design of an analog-digital converter.

Solution to Problem

To solve the issues, an analog-digital converter according to an aspect of the present invention is an analog-digital converter disposed for each at least one column or for each at least one unit pixel and configured to convert an input analog signal into a digital signal. The analog-digital converter includes a comparator configured to compare a voltage of the analog signal with a reference voltage whose voltage value varies in accordance with a reference clock; a low-order bit latch section configured to latch, as low-order bits, Gray code data corresponding to the reference clock by using, as a trigger, inversion of an output of the comparator; and a high-order bit counter section configured to count one or both of edges of a control signal corresponding to the reference clock and configured to stop a count of high-order bits by using, as a trigger, inversion of an output of the comparator.

Advantageous Effects of Invention

The aspect of the present invention has the effect of enabling simplification of the circuit configuration and design of the analog-digital converter.

DESCRIPTION OF EMBODIMENTS

One embodiment, according to the present invention will be described below with reference to FIGS. 1 to 6.

(Configuration of Solid-State imaging Element 1)

Figure 1:
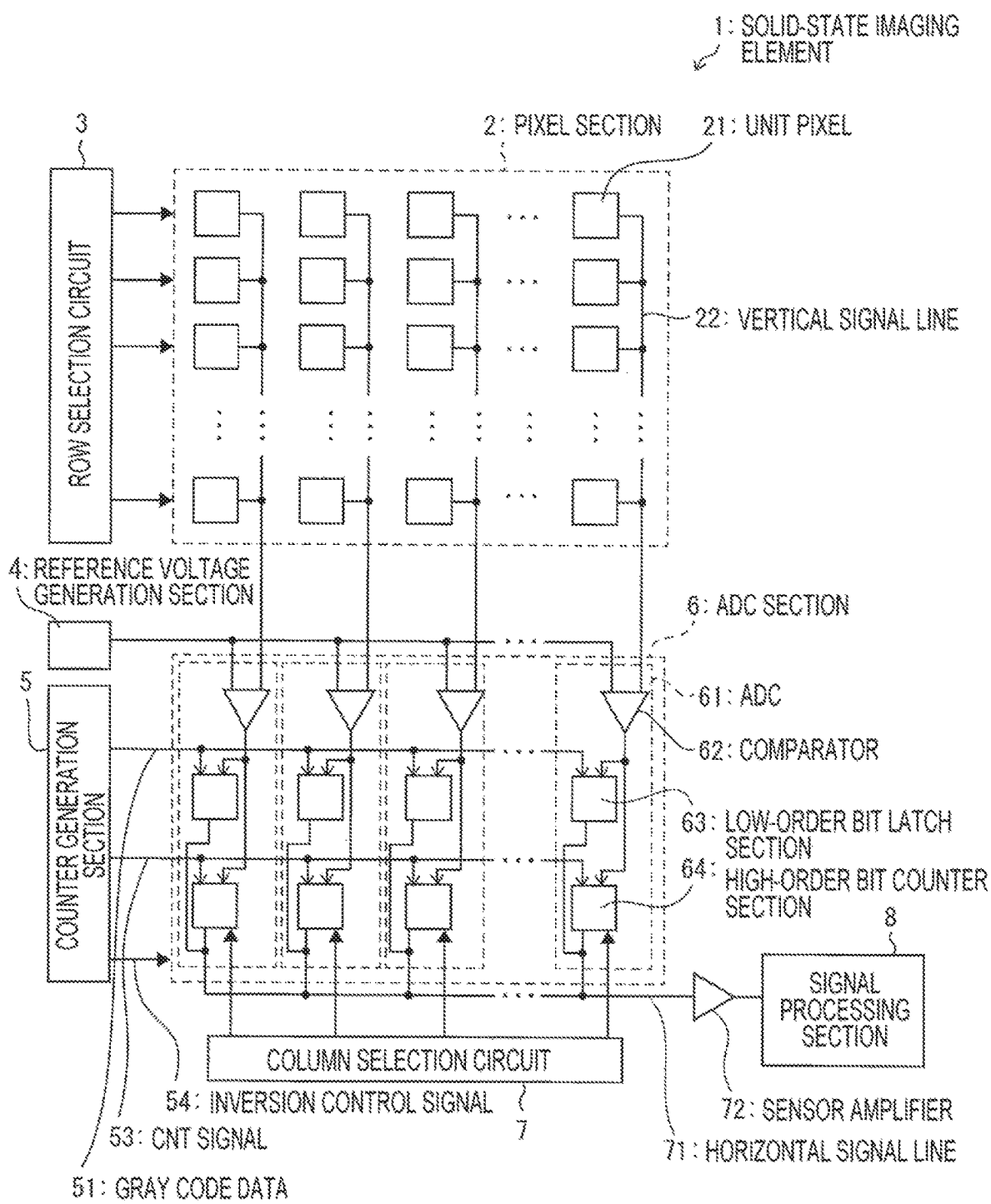
FIG. 1 is a block diagram illustrating an example of a configuration of a solid-state imaging element in which an analog-digital converter according to an embodiment of the present invention is mounted.

FIG. 1 is a block diagram illustrating an example of a configuration of a solid-state imaging element 1 in which an analog-digital converter according to an embodiment of the present invention is mounted. As illustrated in this figure, the solid-state imaging element 1 includes a pixel section 2, a row selection circuit 3, a reference voltage generation section 4, a counter generation section 5, an analog-digital conversion section (ADC section) 6, a column selection circuit 7, and a signal processing section 8. The pixel section 2 includes a plurality of unit pixels 21 arranged in a matrix. The ADC section 6 includes a plurality of analog-digital converters (ADCs) 61. Each of the ADCs 61 includes a comparator 62, a low-order bit latch section 63, and a high-order bit counter section 64.

The row selection circuit 3 outputs a selection signal for selecting unit pixels 21 of any one row to the pixel section 2. Each of the unit pixels 21 to which the selection signal has been input converts incident light into an analog signal and transfers the analog signal to the corresponding ADC 61 through a corresponding vertical signal line 22.

The reference voltage generation section 4 is a type of digital-analog converter (DAC) and generates a voltage whose voltage value varies in accordance with a reference clock. The comparator 62 compares a voltage of the input analog signal with the reference voltage and inverts an output signal at a point in time when the reference voltage exceeds the analog signal voltage.

The counter generation section 5 is disposed corresponding to the ADCs 61. The counter generation section 5 generates Gray code data 51, a CNT signal 53, and an inversion control signal 54, each corresponding to a reference clock, and output the Gray code data 51 to the low-order bit latch section 63. The Gray code data 51 is a type of counter data.

The low-order bit latch section 63 latches, as low-order bits, the Gray code data 51 by using, as a trigger, a point in time when an output of the comparator 62 is inverted. The high-order bit counter section 64 courts one or both of edges of the CNT signal 53 and stops a count of high-order bits by using, as a trigger, inversion an output of the comparator 62.

Each of the ADCs 61 converts the input analog signal into a digital signal and outputs the digital signal to the signal processing section 8 through a horizontal signal line 71. In the solid-state imaging element 1 illustrated in FIG. 1, each of the ADCs 61 is disposed for each column in the pixel section 2. However, the disposition of each ADC 61 is not limited to this. The ADC 61 can also be disposed for each at least one column or for each at least one unit pixel 21. In other words, the ADC 61 can be disposed for each unit pixel 21 or for a plurality of unit pixels 21. A plurality of unit pixels 21 corresponding to the individual ADC 61 may be a combination of any number of unit pixels 21 selected from among all the unit pixels 21.

The column selection circuit 7 selects any unit pixel 21 included in any one column among a plurality of columns. The signal processing section 8 performs signal processing on data transferred to the signal processing section 8 through the horizontal signal line 71. In an example illustrated in FIG. 1, the column selection circuit 7 is a circuit that selects at least one ADC 61. If the ADC 61 is disposed for each unit pixel 21, a pixel selection circuit that selects one unit pixel 21 individually is provided in place of the column selection circuit 7.

(Details of ADC Section 6)

Figure 2:
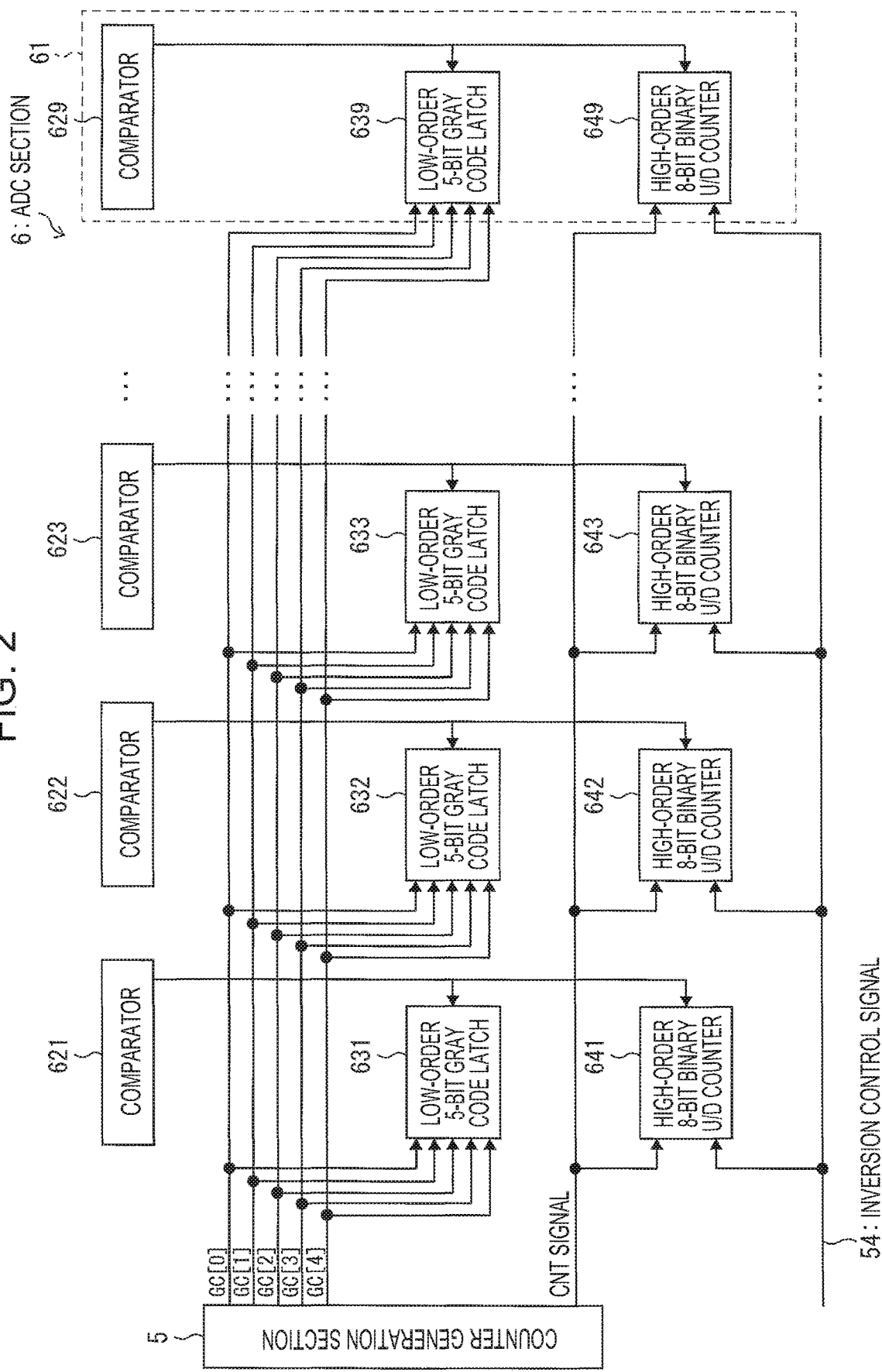
FIG. 2 illustrates an example of a specific configuration of an ADC section according to the embodiment of the present invention.

FIG. 2 illustrates an example of a specific configuration of the ADC section 6 according to the embodiment of the present invention. In the ADC section 6 illustrated in this figure, high-order bits of a digital signal are 8 bits, and low-order bits of the digital signal are 5 bits. Respective comparators 62 are implemented as comparators 621 to 629. Respective low-order bit latch sections 63 are implemented as low-order 5-bit Gray code latches 631 to 639. Respective high-order bit counter sections 64 are implemented as high-order 8-bit binary U/D counters 641 to 649.

The comparators 621 to 629 output respective output signals to the respective corresponding low-order 5-bit Gray code latches 631 to 639 and the respective corresponding high-order 8-bit binary U/D counters 641 to 649.

The counter generation section 5 generates and outputs 5-bit Gray code data GC[0] to GC[4] to the low-order 5-bit Gray code latches 631 to 639. The counter generation section 5 outputs a CIT signal to the low-order 5-bit Gray code latches 631 to 639. The inversion control signal 54 is also input to the high-order 8-bit binary U/D counters 641 to 649.

(Details of ADC 61)

Figure 3:
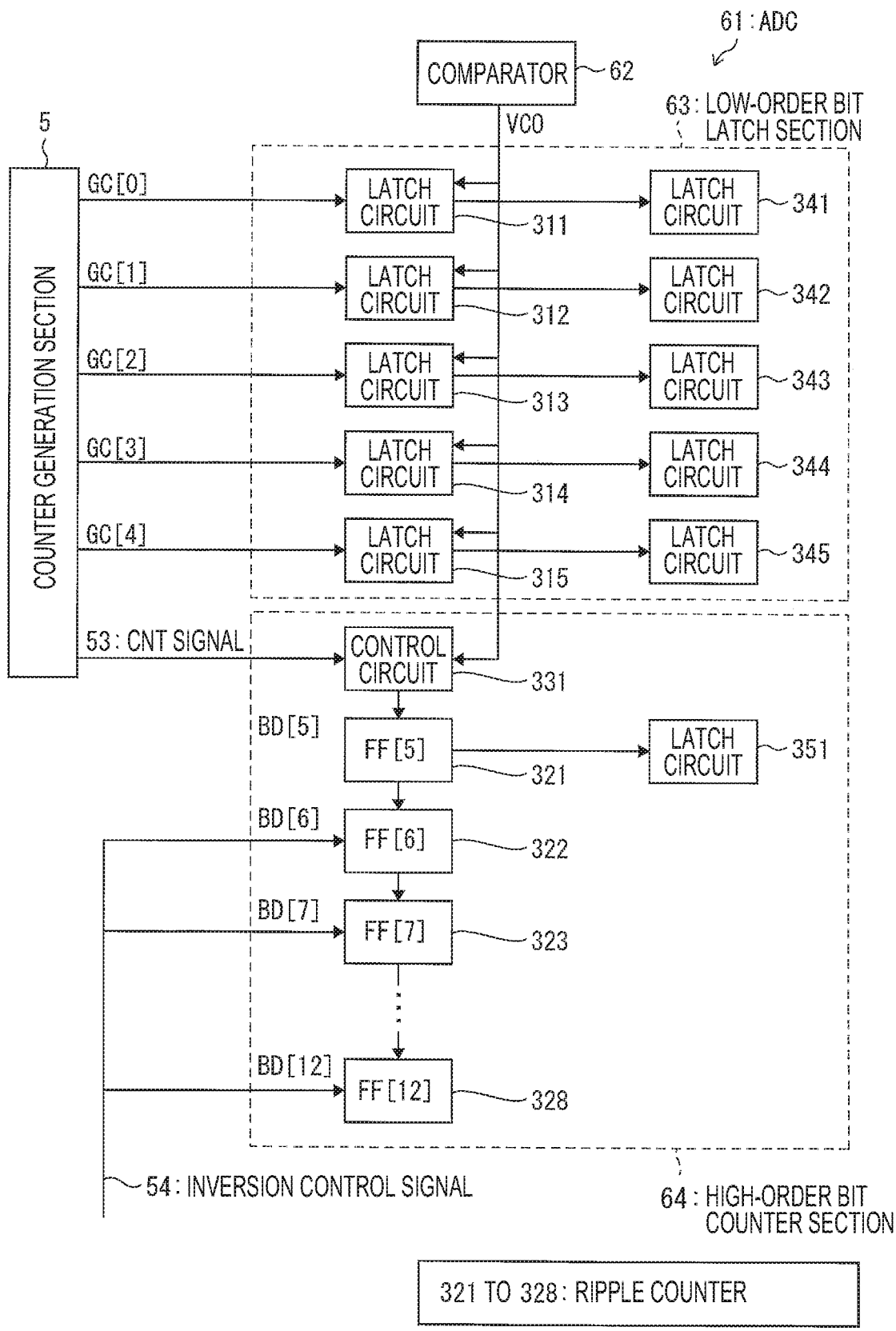
FIG. 3 is a block diagram illustrating a detailed configuration of an ADC according to the embodiment of the present invention.

FIG. 3 is a block diagram illustrating a detailed configuration of the ADC 61 according to the embodiment of the present invention. As illustrated in this figure, the low-order bit latch section 63 includes latch circuits 311 to 315 and 341 to 345. The latch circuits 311 to 315 are connected to the latch circuits 341 to 345 in a one-to-one relationship.

The low-order bit latch section 63 latches input pieces of Gray code data GC[0] to GC[4] for each bit by using the latch circuits 311 to 315. Specifically, the latch circuits 311 to 315 latch any of input pieces of 1-bit Gray code data GC[0] to GC[4] by using, as a trigger, inversion of an output signal (VCO signal) of the comparator 62. The latch circuits 311 to 315 save the latched pieces of Gray code data GC[0] to GC[4] into the corresponding latch circuits 341 to 345.

As illustrated in FIG. 3, the high-order bit counter section 64 includes binary eight stages of cascade-connected ripple counters 321 to 328, a control circuit 331, and a latch circuit 351. The control circuit 331 receives the CNT signal 53 output from the counter generation section 5 and the output signal output from the comparator 62. The control circuit generates a signal FF_IN[5] by using the CNT signal 53 and the VCO signal and outputs the signal FF_IN[5] to the ripple counter 321 for a least significant bit. The ripple counter 321 for a least significant bit latches data into the latch circuit 351.

(Details of High-Order Bit Counter Section 64)

Figure 4:
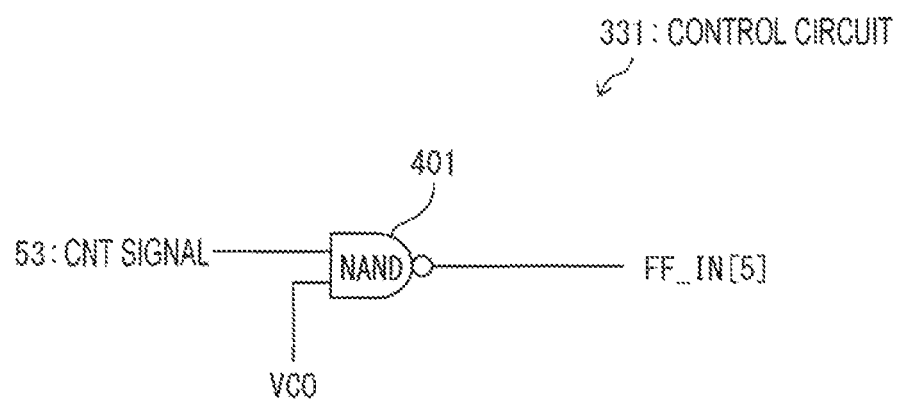
FIG. 4 illustrates examples of configurations of a control circuit and ripple counters that are included in a high-order bit counter section according to the embodiment of the present, invention.
Figure 4:
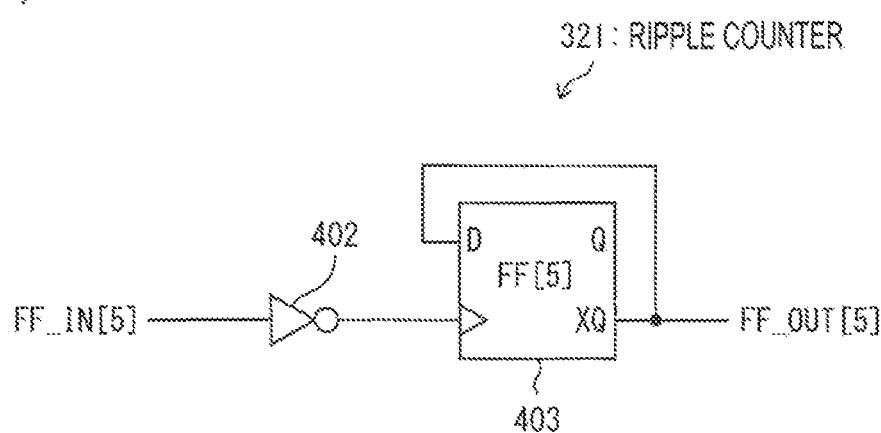
Figure 4:
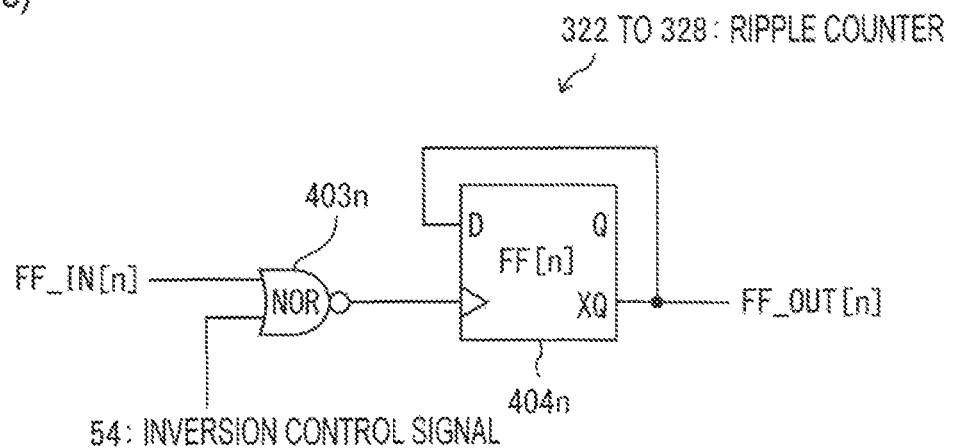

FIG. 4 illustrates examples of configurations of the control circuit 331 and the ripple counters 321 to 328 that are included in the high-order bit counter section 64 according to the embodiment of the present invention. FIG. 4(a) illustrates an example of a configuration of the control circuit 331. FIG. 4(b) illustrates an example of a configuration of the ripple counter 321 of a first stage. FIG. 4(c) illustrates an example of a configuration of each of the ripple counters 322 to 328 of second to eighth stages.

As illustrated in FIG. 4(a), the control circuit 331 includes a NAND 401. The control circuit 331 performs bit inversion in accordance with the CNT signal 53.

As illustrated in FIG. 4(b), the ripple counter 321 includes an inverter 402 and a flip-flop 403. The ripple counter 321 receives, as an input (FF_IN[5]), an output of the control circuit 331 and outputs an output (FF_OUT[5]) to the ripple counter 322 of an immediately subsequent stage.

As illustrated in FIG. 4(c), each of the ripple counters 322 to 328 include a NOR 403n and a flip-flop 404n. Here, n is any of 6 to 12. The ripple counters 322 to 327 receive, as inputs (FF_IN[n]), outputs (FF_OUT[n−1]) of the respective ripple counters 321 to 326 of respective immediately preceding stages and output outputs (FF_OUT[n]) to the respective ripple counters 323 to 328 of respective immediately subsequent stages. Here, n is any of 6 to 11. The ripple counter 328 receives, as an input (FF_IN[12]), an output (FF_OUT[11]) of the ripple counter 327 of an immediately preceding stage.

An analog signal includes first data in an initial state and second data in which signal accumulation (state change) has been achieved. The ripple counters 321 to 328 perform, in accordance with the inversion control signal 54 and the CNT signal 53, bit inversion at any point in time from when a count of the first data in the initial state is finished to when a count of the second data in which signal accumulation has been achieved is started.

(Example of Flow of Operation)

Figure 5:
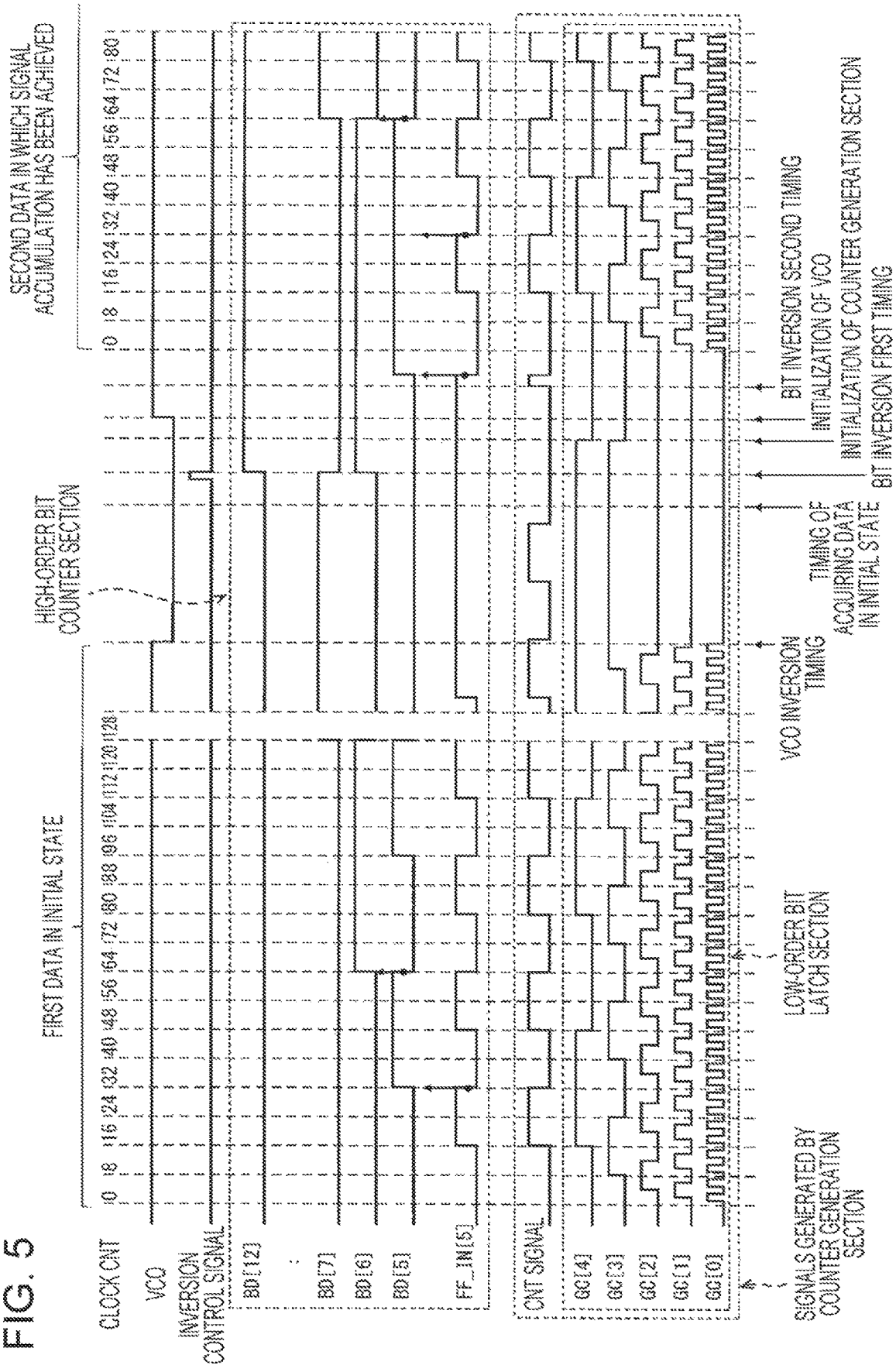
FIG. 5 illustrates an example of a flow of operation of the ADC according to the embodiment of the present invention.

FIG. 5 illustrates an example of a flow of operation of the ADC 61 according to the embodiment of the present invention. As illustrated in this figure, the ADC 61 causes only any one among any of the input pieces of Gray code data. GC[0] to GC[4] and the CNT signal 53 to make a transition for a reference clock. In other words, the high-order bit counter section 64 does not cause one or either of edges of the CNT signal 53 to make a transition simultaneously with a plurality of low-order hits corresponding to the Gray code data 51 generated corresponding to the reference clock. This can keep the plurality of low-order bits corresponding to the Gray code data 51 and a least significant bit of a plurality of high-order bits from simultaneously making transitions with the same reference clock timing. The low-order bit latch section 63 latches the pieces of Gray code data GC[0] to GC[4] at a point in time when the output signal (VCO) of the comparator 62 is inverted.

The ADC 61 fixes the CNT signal 53 to a Low potential at the point in time when the VCO is inverted. Thus, a count of high-order bits made by the high-order bit counter section 64 stops.

After all pieces of data dealt With by the ADC 61 are determined, the ADC 61 latches the low-order bits of the Gray code data latched by the low-order bit latch section 63 into the respective latch circuits 341 to 345 and latches a least significant bit counted by the high-order bit counter section 64 into the latch circuit 351.

The inversion control signal 54 makes a transition from a High potential to a Low potential with bit inversion first timing illustrated in FIG. 5. High-order bits counted with this timing are data less than a one's complement only by one. Furthermore, when the CNT signal 53 is caused to make a transition from a High potential to a Low potential with bit inversion second timing illustrated in FIG. 5 counted high-order bits are a one's complement (bit-inverted data). In the present embodiment, the number of transitions made by the CNT signal 53 with the bit inversion second timing is one, and bit-inverted data is a one's complement. However, when the number of transitions of the CNT signal 53 is changed, a bit-inverted signal can be a one's complement+X (where X is an integer of −1 or greater). Furthermore, the bit inversion second timing may be timing after a count of the second data is finished.

In the present embodiment, bit-inverted data is a one's complement, and after bits are inverted, a result obtained by counting the second data in which signal accumulation (state change) has been achieved is data less than the first data only by one. In the case where an absolute increment in the second data from the first data is desired to be obtained, when the number of transitions of the CNT signal 53 is set to two, bit-inverted data only has to be a two's complement. Furthermore, the case where only the relative amount of change in second data of a unit pixel 21 relative to second data of another unit pixel 21 is obtained, an operation is unnecessary in which the CNT signal 53 is caused to make a transition from a High potential to a Low potential. In this case, a calculated result is less than an absolute increment by two.

The solid-state imaging element 1 initializes the counter generation section 5 before processing the second data in which signal accumulation has been achieved. As in the initial state, at a point in time when an output (VCO) of the comparator 62 is inverted, the low-order bit latch section 63 latches pieces of Gray code data, and the high-order bit counter section 64 stops a count of high-order bits.

Subsequently, the ADC 61 transfers, as GD_S[0] to GD_S[4], the pieces of Gray code data latched by the latch circuits 311 to 315 to the signal processing section 8 through the horizontal signal line 71 and a sensor amplifier 72. The ADC 61 further transfers, as pieces of Gray code data GD_R[0] to GD_R[4], the pieces of Gray code data latched by the latch circuits 341 to 345 to the signal processing section 8 through the horizontal signal line 71 and the sensor amplifier 72. The ADC 61 further transmits, as binary data BD_R[5], data latched by the latch circuit 351 to the signal processing section 8. The ADC 61 further transmits, as pieces of binary data BD_S[5] to BD_S[12], pieces of data generated by the ripple counters 321 to 328 to the signal processing section 8. The signal processing section 8 reconstructs binary data by using each input piece of data.

(Example of Configuration of Gray-Binary Conversion Circuit)

Figure 6:
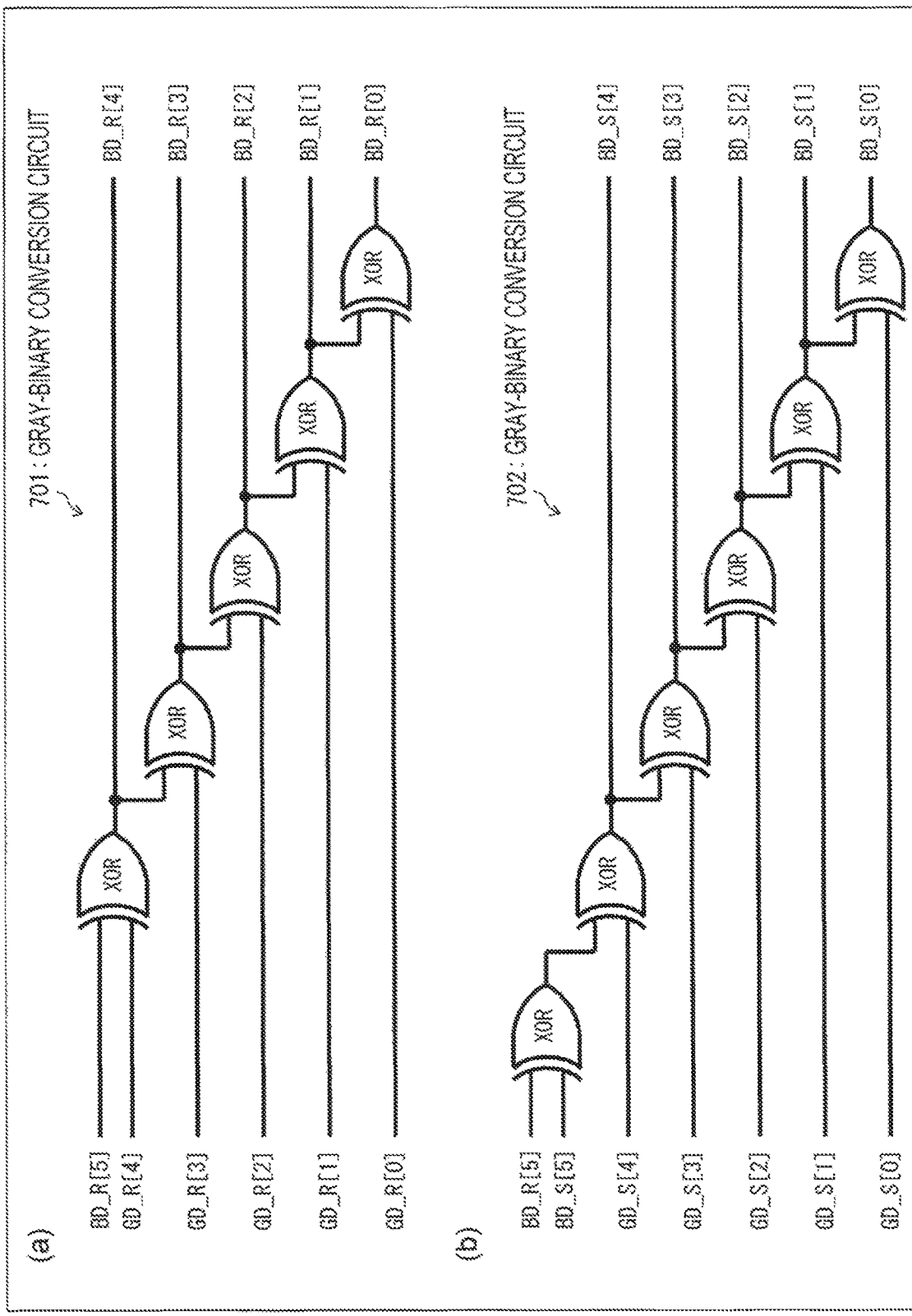
FIG. 6 illustrates examples of configurations of Gray-binary conversion circuits for reconstructing binary data from Gray code data transmitted to a signal processing section.
Figure 7:
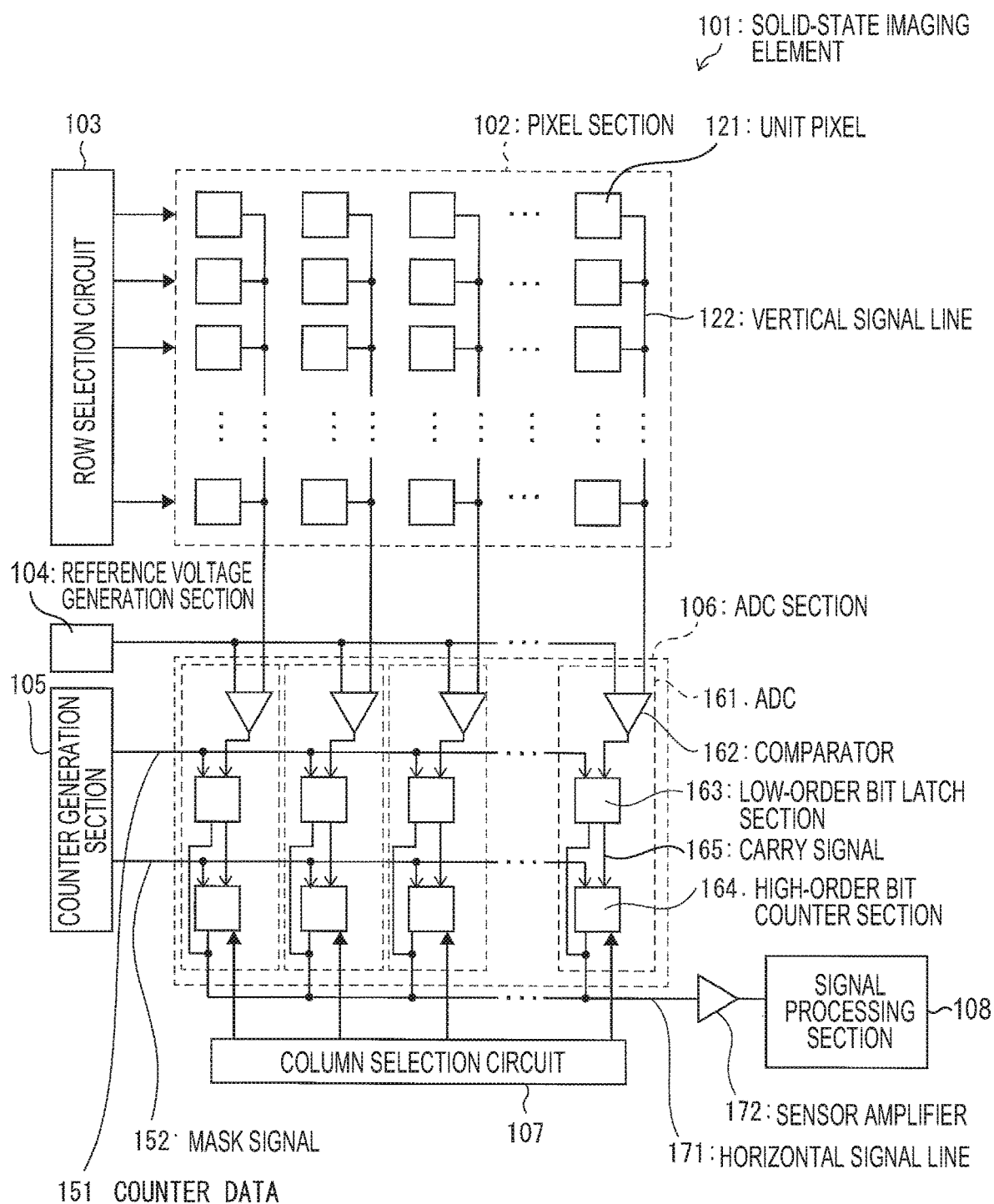
FIG. 7 is a block diagram illustrating an example of a configuration of a solid state imaging element in which an existing analog-digital converter disclosed in PTL 1 is mounted.

FIG. 6 illustrates examples of configurations of Gray-binary conversion circuits 701 and 702 for reconstructing binary data from Gray code data transmitted to the signal processing section 8. FIG. 6(a) illustrates an example of a configuration of the Gray-binary conversion circuit 701 for processing the first data in an initial state. FIG. 6(b) illustrates an example of a configuration of the Gray-binary conversion circuit 702 for processing the second data in which signal accumulation has been achieved. The Gray-binary conversion circuits 701 and 702 are included in the signal processing section 8.

As illustrated in FIG. 6(*a*), the Gray-binary conversion circuit 701 generates pieces of binary data BD_R[0] to BD_R[4] of low-order bits of the first data in the initial, state by subjecting the input binary data BD_R[5] and the input pieces of Gray code data GD_R[0] to GD_R[4] to conversion processing. As illustrated in FIG. 6(*b*), the Gray-binary conversion circuit 702 generates, by subjecting the input binary data BD_R[5], the input binary data BD_S[5], and the input pieces of Gray code data GD_S[0] to GD_S[4] to conversion processing, pieces of binary data BD_S[0] to BD_S[4] of low-order bits of the second data in which signal accumulation has been achieved.

The signal processing section 8 generates combined data by making a bit combination of the generated pieces of binary data BD_S[0] to BD_S[4] of the low-order bits with pieces of high-order binary data ED[5]_S to ED[12]_S obtained through subtraction processing of subtracting the first data in the initial state from the second data in which signal accumulation has been achieved. Furthermore, the signal processing section 8 subtracts, from the combined data, the pieces of binary data BD_R[0] to BD_R[4] of the low-order bits of the first data in the initial state that has not been subjected to subtraction processing and can thereby obtain a value obtained by subtracting the first data in the initial state from the second data in which signal accumulation has been achieved and subtracting only one from a least significant bit of high-order bits of a resultant subtracted value. In the signal processing section 8, correction processing is performed on an absolute value in many cases, and it is only necessary to obtain a relative difference relative to another unit pixel 21 in many cases. Incidentally, if one is added to the least significant bit of the high-order bits of the subtracted value, an absolute increment can be calculated. If one is added by causing the CNT signal 53 to make a transition from a High potential to a Low potential in a DID counter, one does not have to be added to the least significant bit of the high-order bits in the signal processing section 8.

The ADC 61 according to the present embodiment generates no carry signal by using the low-order bit latch section 63 and transmits, aside from data transmitted to the low-order bit latch section 63, a control signal (CNT signal 53) used for a count of high-order bits made by the high-order bit counter section 64 to the high-order bit counter section 64. Thus, the ADC 61 can control points in time when a plurality of bits of low-order bits and a least significant bit of high-order bits change so that they are points in time when a bit inconsistency does not occur. Hence, the circuit configuration and design of the ADC 61 can be simplified.

SUMMARY

An analog-digital converter according to an aspect 1 of the present invention is an analog-digital converter disposed for each at least one column or for each at least one unit pixel and configured to convert an input analog signal into a digital signal. The analog-digital converter includes a comparator configured to compare a voltage of the analog signal with a reference voltage whose voltage value varies in accordance with a reference clock; a low-order bit latch section configured to latch, as low-order bits, Gray code data corresponding to the reference clock by using, as a trigger, inversion of an output of the comparator; and a high-order bit counter section configured to count one or both of edges of a control signal corresponding to the reference clock and configured to stop a count of high-order bits by using, as a trigger, inversion of an output of the comparator.

The configuration can keep a bit inconsistency from occurring without generating any mask signal, thereby enabling simplification of the circuit configuration and design of the analog-digital converter.

In the aspect 1, in the analog-digital converter according to an aspect 2 of the present invention, the high-order bit counter section does not cause one or either of the edges of the control signal to make a transition simultaneously with a plurality of the low-order bits corresponding to the Gray code data generated corresponding to the reference clock.

The configuration can keep the plurality of the low-order bits corresponding to the Gray code data and a least significant bit of a plurality of high-order bits from simultaneously making transitions with the same reference clock timing.

In the aspect 1, in the analog-digital converter according to an aspect 3 of the present invention, the high-order hit counter section includes a plurality of ripple counters that are cascade-connected, and the analog signal includes first data in an initial state and second data in which signal accumulation has been achieved. Each of the ripple counters performs, in accordance with the control signal, bit inversion to provide a one's complement+X (where X is an integer of −1 or greater) by, using an inversion control signal and the control signal at any point in time from when a count of the first data is finished to when a count of the second data is started and the high-order bit counter section latches, in accordance with the control signal, a least significant hit of a plurality of the high-order bits corresponding to the first data at any point in time. The control signal is independent from the low-order bit latch section, thereby enabling the control signal to make a transition independently. Furthermore, inverted data can be data of a one's complement+X (where X is an integer of −1 or greater) with the circuit configuration of the analog-digital converter unchanged.

The configuration enables storage of a value of the least significant bit of the high-order bits that is unidentifiable due to level fluctuations and enables binary data to be reconstructed exactly by combination with information on the low-order bits. Furthermore, inverted data is variable in a range of a one's complement+X (where X is an integer of −1 or greater) with the circuit configuration of the analog-digital converter unchanged, and specifications of the analog-digital converter can be readily changed depending on intended use.

In the aspect 3, the analog-digital converter according to an aspect 4 of the present invention further includes a horizontal signal line; and a signal processing section configured to perform signal processing on transferred data. The low-order bit latch section transfers low-order bits corresponding to the first data to the signal processing section through the horizontal signal line. The high-order bit counter section transfers the latched least significant bit of the plurality of the high-order bits corresponding to the first data at a point in time when a count of the first data is finished to the signal processing section through the horizontal signal line. The signal processing section reconstructs binary data of the low-order bits corresponding to the first data.

The configuration enables binary data of the low-order bits to be reconstructed.

In the aspect 3, the analog-digital converter according to an aspect 5 of the present invention further includes a horizontal signal line; and a signal processing section configured to perform signal processing on transferred data. The low-order bit latch section transfers the low-order bits corresponding to the second data to the signal processing section through the horizontal signal line. The high-order bit counter section transfers the latched least significant bit of the plurality of the high-order bits corresponding to the first data at a point in time when a count of the first data is finished and a least significant bit of a plurality of the high-order bits corresponding to the second data at a point in time when a count of the second data is finished to the signal processing section through the horizontal signal line. The signal processing section reconstructs binary data of the low-order bits corresponding to the second data.

The configuration enables binary data of the low-order bits to be reconstructed exactly.

In the aspect 4 or 5, in the analog-digital converter according to an aspect 6 of the present invention, the signal processing section calculates a data increment in the second data from the first data by subtracting, from combined data obtained by making a bit combination of the low-order bits corresponding to the second data whose binary data has been reconstructed with the high-order bits after a count of the second data is finished, the low-order bits corresponding to the first data whose binary data has been reconstructed.

The configuration enables a data increment to be calculated exactly.

A solid-state imaging element according to an aspect 7 of the present invention includes a pixel section configured to convert incident light into an analog signal; the analog-digital converter according to any of the aspects 1 to 6 configured to convert the analog signal into a digital signal; and a vertical signal line configured to transfer the analog signal from the pixel section to the analog-digital converter.

The configuration can provide the solid-state imaging element that can keep a bit inconsistency from occurring without generating any mask signal.

The present invention is not limited to embodiment described above, and various modifications can be made within the scope described in claims. An embodiment obtained by appropriately combining technical means disclosed in embodiment is also included in a technical scope of the present invention. New technical features can be formed by combining technical means disclosed in the embodiments.

REFERENCE SIGNS LIST

1 solid-state imaging element, 2 pixel section, 3 row selection circuit, 4 reference voltage generation section, 5 counter generation section, 6 ADC section, 7 column selection circuit, 8 signal processing section, 21 unit pixel, 22 vertical signal line, 51 Gray code data, 53 CNT signal, 54 inversion control signal, 61 ADC (analog-digital converter), 62 comparator, 63 low-order bit latch section, high-order bit counter section, 71 horizontal signal line, 72 sensor amplifier

The invention claimed is:

1. An analog-digital converter disposed for each at least one column or for each at least one unit pixel and configured to convert an input analog signal into a digital signal, the analog-digital converter comprising:
   a comparator configured to compare a voltage of the analog signal with a reference voltage whose voltage value varies in accordance with a reference clock;
   a low-order bit latch section configured to latch, as low-order bits, Gray code data corresponding to the reference clock by using, as a trigger, inversion of an output of the comparator; and
   a high-order bit counter section configured to count one or both of edges of a control signal corresponding to the reference clock and configured to stop a count of high-order bits by using, as a trigger, inversion of an output of the comparator.

2. The analog-digital converter according to claim 1, wherein the high-order bit counter section does not cause one or either of the edges of the control signal to make a transition simultaneously with a plurality of the low-order bits corresponding to the Gray code data.

3. The analog-digital converter according to claim 1,
   wherein the high-order bit counter section includes a plurality of ripple counters that are cascade-connected,
   wherein the analog signal includes first data in an initial state and second data in which signal accumulation has been achieved, and
   wherein each of the ripple counters performs, in accordance with the control signal, bit inversion to provide a one's complement+X (where X is an integer of −1 or greater) by using an inversion control signal and a control signal at any point in time from when a count of the first data is finished to when a count of the second data is started and the high-order bit counter section latches, in accordance with the control signal, a least significant bit of a plurality of the high-order bits corresponding to the first data at any point in time.

4. The analog-digital converter according to claim 3 further comprising:
   a horizontal signal line; and a signal processing section configured to perform signal processing on transferred data,
   wherein the low-order bit latch section transfers low-order bits corresponding to the first data to the signal processing section through the horizontal signal line,
   wherein the high-order bit counter section transfers the latched least significant bit of the plurality of the high-order bits corresponding to the first data at a point in time when a count of the first data is finished to the signal processing section through the horizontal signal line, and
   wherein the signal processing section reconstructs binary data of the low-order bits corresponding to the first data.

5. The analog-digital converter according to claim 3 further comprising:
   a horizontal signal line; and a signal processing section configured to perform signal processing on transferred data,
   wherein the low-order bit latch section transfers the low-order bits corresponding to the second data to the signal processing section through the horizontal signal line,
   wherein the high-order bit counter section transfers the latched least significant bit of the plurality of the high-order bits corresponding to the first data at a point in time when a count of the first data is finished and a least significant bit of a plurality of the high-order bits corresponding to the second data at a point in time when a count of the second data is finished to the signal processing section through the horizontal signal line, and
   wherein the signal processing section reconstructs binary data of the low-order bits corresponding to the second data.

6. The analog-digital converter according to claim 4, wherein the signal processing section calculates a data increment in the second data from the first data by subtracting, from combined data obtained by making a bit combination of the low-order bits corresponding to the second data whose binary data has been reconstructed with the high-order bits after a count of the second data is finished, the low-order bits corresponding to the first data whose binary data has been reconstructed.

7. A solid-state imaging element comprising:
- a pixel section configured to convert incident light into an analog signal;
- the analog-digital converter according to claim 1 configured to convert the analog signal into a digital signal; and
- a vertical signal line configured to transfer the analog signal from the pixel section to the analog-digital converter.

* * * * *